(12) United States Patent
Okada

(10) Patent No.: US 7,855,371 B2
(45) Date of Patent: Dec. 21, 2010

(54) IMAGE DETECTION APPARATUS AND METHOD FOR PRODUCING THE APPARATUS

(75) Inventor: Yoshihiro Okada, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 450 days.

(21) Appl. No.: 12/058,732

(22) Filed: Mar. 30, 2008

(65) Prior Publication Data

US 2008/0237758 A1    Oct. 2, 2008

(30) Foreign Application Priority Data

Mar. 29, 2007   (JP) .............................. 2007-086964

(51) Int. Cl.
*H01L 27/146* (2006.01)

(52) U.S. Cl. ............................. 250/370.09; 250/370.01

(58) Field of Classification Search ............ 250/370.01, 250/370.09, 370.11
See application file for complete search history.

(56) References Cited

U.S. PATENT DOCUMENTS 6,225,632 B1   5/2001   Kinno et al.

FOREIGN PATENT DOCUMENTS

JP   2002-026300 A   1/2002

*Primary Examiner*—David P Porta
*Assistant Examiner*—Mark R Gaworecki
(74) *Attorney, Agent, or Firm*—Sughrue Mion, PLLC

(57) ABSTRACT

An image detection apparatus includes a substrate, a middle layer formed on the substrate, the middle layer having a quadrilateral hole, and a photoelectric conversion layer deposited on the middle layer. The curvature radius of each of the corner portions of the quadrilateral hole is greater than or equal to 2 μm. Further, the photoelectric conversion layer is made of an amorphous material.

11 Claims, 5 Drawing Sheets

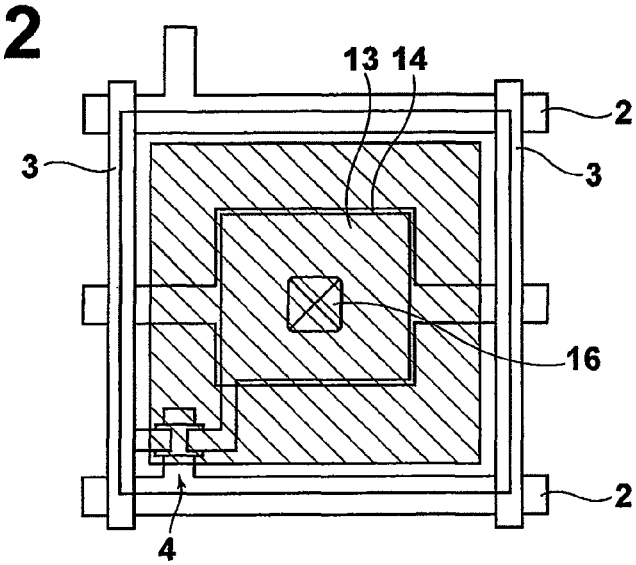
FIG.2
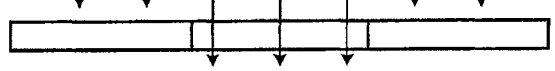
PHOTOLITHOGRAPHY (EXPOSURE)

CORNER PORTIONS OF CONTACT HOLE PATTERN OF PHOTOMASK ARE BEVELED

$R \leq 4 \mu m$

R ≦ 1.5 μm

IMAGE DETECTION APPARATUS AND METHOD FOR PRODUCING THE APPARATUS

BACKGROUND OF THE INVENTION

1. Field of the Invention

The present invention relates to an image detection apparatus that generates charges by irradiation with radiation. Particularly, the present invention relates to the structure of a drive circuit substrate of the image detection apparatus and a method for producing the drive circuit substrate.

2. Description of the Related Art

In recent years, FPD's (flat panel detectors), which can directly convert X-ray information into digital data, have become practically used. In the FPD, an X-ray-sensitive layer is formed on a TFT active matrix array. The advantage of the FPD's over conventional imaging plates is that images can be immediately checked in the FPD's. Further, in the FPD's, video images (or motion pictures) as well as still images can be checked. Therefore, the FPD's have rapidly become used by many users.

The image detection apparatus, which is called as FPD, can directly detect image signals. Therefore, it is possible to detect accurate images. However, in some cases, various kinds of noises are added to image signals that should originally be detected.

One of the examples of such noises is a leak current (leak electric current) of a TFT switch. It is desirable that the TFT switch for selecting a detection pixel does not transmit any leak current when the TFT switch is OFF. However, a certain amount of leak current is transmitted due to the characteristic of the device and the transmitted leak current is added to image signals in some cases.

As the material for a photoelectric conversion layer of the image detection apparatus, amorphous Se is used in many cases because amorphous Se has high dark resistance and high response speed. Further, a smoothing layer (interlayer insulation layer) made of an organic material is formed under the amorphous Se layer in many cases. The smoothing layer is formed to smooth a surface on which the amorphous Se layer is deposited (for example, U.S. Pat. No. 6,225,632 and Japanese Patent No. 3589954).

When a photoelectric conversion layer of the image detection apparatus is formed by depositing amorphous Se by evaporation, if the amorphous Se locally crystallizes, a leak current sharply increases in the locally crystallized portion of the amorphous Se. Consequently, it becomes difficult to recognize detection signals, which should originally be detected. In the Se layer that has been deposited by evaporation, crystallization tends to progress especially in an uneven area of the lower layer under the Se layer because crystallization is induced by internal stress generated during vapor deposition.

The structure of an image detection apparatus according to the related art will be described with reference to FIGS. 6 and 7. FIG. 6 is a schematic diagram illustrating a cross-section of the image detection apparatus according to the related art. In FIG. 6, a one-pixel portion of the image detection apparatus according to the related art is illustrated. FIG. 7 is a schematic diagram illustrating a plan view of the image detection apparatus according to the related art. In an image detection apparatus of a direct-conversion type using a layer made of Se or the like as a photoelectric conversion layer 6, it is necessary to place a charge collection electrode 11 between the photoelectric conversion layer 6 and an interlayer insulation layer 12. The charge collection electrode 11 collects charges (electric charges) generated in the photoelectric conversion layer 6.

Then, signals are transmitted through a contact hole 16 formed in the interlayer insulation layer 12 and stored in a capacitance between a storage capacitance upper-electrode 13 and a storage capacitance lower-electrode 14 below the interlayer insulation layer 12. Therefore, although the interlayer insulation layer 12 is formed originally to smooth the surface on which the photoelectric conversion layer 6 is deposited, it is necessary to form a contact hole 16 in the interlayer insulation layer 12 at least for each pixel.

The inventors of the present invention have conducted intensive studies and found out that crystallization induced by a height difference of the contact hole 16 (a bent portion of the charge collection electrode 11) tends to frequently occur in a portion of the photoelectric conversion layer 6, the portion on the upper side of the contact hole 16. If such crystallization occurs, a leak current of Se increases in some specific pixels. Consequently, the leak current increases and affects data of other pixels. Hence, it becomes difficult to recognize detection signals, which should originally be detected.

SUMMARY OF THE INVENTION

In view of the foregoing circumstances, it is an object of the present invention to provide an image detection apparatus that can reduce a leak current.

An image detection apparatus of the present invention is an image detection apparatus comprising:

a substrate;

a middle layer formed on the substrate, the middle layer having a quadrilateral hole; and a photoelectric conversion layer deposited on the middle layer, the photoelectric conversion layer being made of an amorphous material, wherein the curvature radius of each of the corner portions of the quadrilateral hole is greater than or equal to 2 μm.

The middle layer refers to a layer (film or coating), such as a smoothing layer and an interlayer insulation layer, formed between the substrate and the photoelectric conversion layer.

It is desirable that the image detection apparatus further includes a voltage application electrode formed on the photoelectric conversion layer.

According to another embodiment of the present invention, the image detection apparatus of the present invention is an image detection apparatus comprising:

a substrate;

a smoothing layer formed on the substrate, the smoothing layer having a quadrilateral contact hole;

a collection electrode formed at least in the quadrilateral contact hole of the smoothing layer;

a photoelectric conversion layer deposited on the smoothing layer, in which the collection electrode is formed, the photoelectric conversion layer being made of an amorphous material; and a signal extraction electrode connected to the collection electrode through the quadrilateral contact hole, wherein the curvature radius of each of the corner portions of the quadrilateral contact hole is greater than or equal to 2 μm.

Further, the photoelectric conversion layer is made of a material containing amorphous Se as a main component, and the material is deposited by using a vapor-deposition (evaporation) method. Optionally, the side wall of the contact hole may be tapered.

A method for producing an image detection apparatus of the present invention is a method comprising the steps of:

applying a smoothing layer to a flat substrate;

performing photolithography on the smoothing layer using a photomask so as to form a quadrilateral hole in the smoothing layer, the photomask having a hole portion with a beveled edge; and depositing an amorphous photoelectric conversion material on the smoothing layer by using a vapor deposition method.

The image detection apparatus of the present invention is an image detection apparatus comprising:

a substrate;

a middle layer formed on the substrate, the middle layer having a quadrilateral hole; and a photoelectric conversion layer deposited on the middle layer, the photoelectric conversion layer being made of an amorphous material, wherein the curvature radius of each of the corner portions of the quadrilateral hole is greater than or equal to 2 µm. Therefore, it is possible to suppress crystallization induced by a height difference of a contact hole in the middle layer. Hence, it is possible to reduce a leak current.

Particularly, when the image detection apparatus further includes a voltage application electrode formed on the photoelectric conversion layer, if a high voltage (approximately at 2 kV) is applied, crystallization induced by a height difference of the contact hole in the middle layer progresses even more and a higher leak current flows. However, if a middle layer having a hole, each of the corner portions of which has a curvature radius that is greater than or equal to 2 µm, is formed, even if high voltage is applied, it is possible to suppress crystallization. Consequently, it is possible to reduce a leak current.

According to another embodiment of the present invention, the image detection apparatus of the present invention is an image detection apparatus comprising:

a substrate;

a smoothing layer formed on the substrate, the smoothing layer having a quadrilateral contact hole;

a collection electrode formed at least in the quadrilateral contact hole of the smoothing layer;

a photoelectric conversion layer deposited on the smoothing layer, in which the collection electrode is formed, the photoelectric conversion layer being made of an amorphous material; and a signal extraction electrode connected to the collection electrode through the quadrilateral contact hole, wherein the curvature radius of each of the corner portions of the quadrilateral contact hole is greater than or equal to 2 µm. Therefore, it is possible to suppress crystallization induced by a height difference of the contact hole in the smoothing layer. Further, it is possible to reduce a leak current.

BRIEF DESCRIPTION OF THE DRAWINGS

FIG. 2 is a schematic diagram illustrating a plan view of an image detection apparatus according to an embodiment of the present invention, the plan view showing the structure of a one-pixel portion of the image detection apparatus;

DESCRIPTION OF THE PREFERRED EMBODIMENTS

Figure 1:
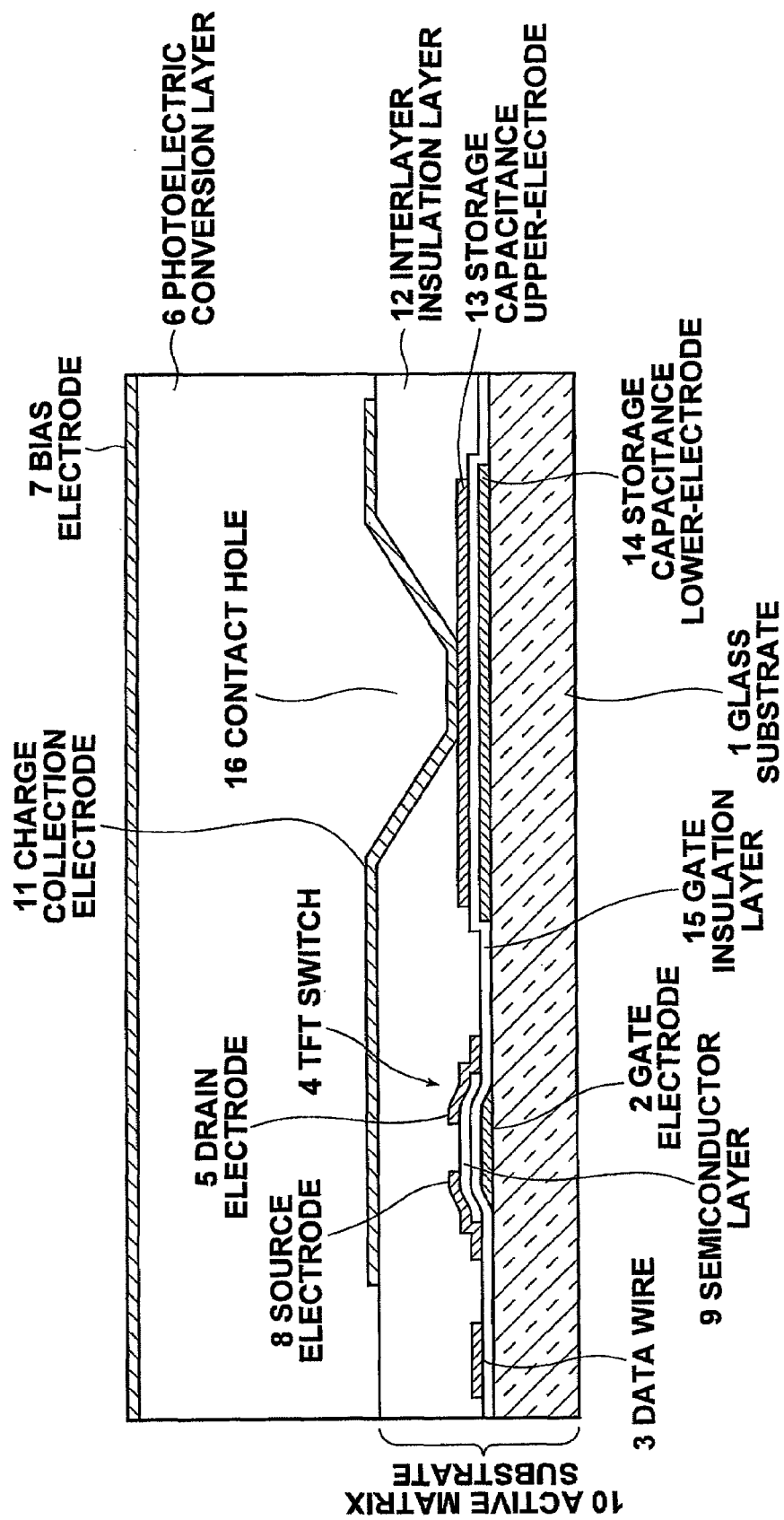
FIG. 1 is a schematic diagram illustrating a cross-section of an image detection apparatus according to an embodiment of the present invention, the cross-section showing the structure of a one-pixel portion of the image detection apparatus.

Hereinafter, an image detection apparatus according to the present invention will be described with reference to the attached drawings. FIG. 1 is a schematic diagram illustrating a cross-section of an image detection apparatus according to an embodiment of the present invention. The cross-section shows a one-pixel portion of the image detection apparatus. FIG. 2 is a schematic diagram illustrating a plan view of the one-pixel portion of the image detection apparatus.

As illustrated in FIG. 1, in the image detection apparatus of the present invention, a photoelectric conversion layer 6 and a bias electrode (voltage application electrode: common electrode) 7 are sequentially formed on an active matrix substrate 10. The photoelectric conversion layer 6 conducts electromagnetic waves. The bias electrode 7 is connected to a high-voltage power source, which is not illustrated. The photoelectric conversion layer 6 generates charges (pairs of electrons and holes) within the layer by irradiation with electromagnetic waves, such as X rays. In other words, the photoelectric conversion layer 6 conducts electromagnetic waves and converts image information represented by X rays into information represented by charges. The photoelectric conversion layer 6 is made of amorphous Se (a-Se: amorphous selenium), which contains selenium as a main component, for example. The term "main component" refers to a component, of which the content is greater than or equal to 50%.

The active matrix substrate 10 includes a glass substrate 1, a gate electrode 2, a storage capacitance lower-electrode 14, a gate insulation layer 15, a storage capacitance upper-electrode 13, a semiconductor layer 9, a source electrode 8, a drain electrode 5, a data wire, an interlayer insulation layer 12, which is a smoothing layer, and a charge collection electrode 11. Further, a thin film transistor (TFT: Thin Film Transistor, hereinafter referred to as a TFT switch) 4 is formed by the gate electrode 2, the gate insulation layer 15, the source electrode 8, the drain electrode 5, the semiconductor layer 9 and the like. The TFT switch 4 is a switching device. Further, the source electrode 8 and the drain electrode 5 are connected to the data wire 3 and the storage capacitance upper-electrode 13, respectively. The semiconductor layer 9 enables contact of the source electrode 8, the drain electrode 5 and the gate electrode 2 with each other.

The glass substrate 1 is a substrate (support base plate). As the glass substrate 1, a non-alkaline glass substrate (#1737 produced by Corning Incorporated or the like, for example) may be used, for example. The gate electrode 2 and the data wire 3 are electrode wires that are arranged in grid form, as illustrated in FIG. 2. Further, the TFT switch 4 is formed at the intersection of the gate electrode 2 and the data wire 3.

The gate insulation layer 15 is made of SiNx, SiOx or the like. The gate insulation layer 15 is provided so as to coat (cover) the gate electrode 2 and the storage capacitance lower-electrode 14. A portion of the gate insulation layer 15, the portion positioned on the gate electrode 2, acts as a gate insulation layer in the TFT switch 4. Further, a portion of the gate insulation layer 15, the portion positioned on the storage capacitance lower-electrode 14, acts as a dielectric layer in the charge storage capacitance. Specifically, the charge storage capacitance is formed in an area in which the storage capacitance lower-electrode 14 and the storage capacitance upper-electrode 13 are superposed one on the other. The storage capacitance lower-electrode 14 is formed on the same layer as the gate electrode 2. It is not necessary that the gate insulation layer 15 is made of SiNx or SiOx. An anodized film (layer) obtained by anodizing the gate electrode 2 and the storage capacitance lower-electrode 14 may be used together with the gate insulation layer 15.

The charge collection electrode 11 is formed by an amorphous transparent conductive oxidized film (amorphous transparent electric conductive oxidized layer). The charge collection electrode 11 is formed in such a manner that a contact hole 16 positioned on a portion of the storage capacitance upper-electrode 13, the portion facing the storage capacitance lower-electrode 14 through the charge storage capacitance, is filled with the charge collection electrode 11. Further, the charge collection electrode 11 is deposited (formed) over the source electrode 8 and the storage capacitance upper-electrode 13. The charge collection electrode 11 and the photoelectric conversion layer 6 are electrically connected to each other, and the charge collection electrode 11 can collect charges generated in the photoelectric conversion layer 6. Further, the charge collection electrode 11 needs to collect charges generated in the photoelectric conversion layer 6 and to output the collected charges to the outside through the TFT and the data wire 3. Therefore, the charge collection electrode 11 is electrically connected to the drain electrode 5 in the TFT switch 4 and the charge storage capacitance through the contact hole 16, which is formed in the interlayer insulation layer 12. The photoelectric conversion layer 6 needs to transfer charges to the charge collection electrode 11. Therefore, the photoelectric conversion layer 6 is formed directly on the charge collection electrode 11.

The interlayer insulation layer 12 is made of a photosensitive alkaline resin and electrically separates (insulates) the TFT switch 4. In the interlayer insulation layer 12, the contact hole 16 is formed therethrough, and the charge collection electrode 11 is connected to the storage capacitance upper-electrode 13. Specifically, the charge collection electrode 11 is connected to the charge capacitance upper-electrode 13, which is a signal extraction electrode, through the contact hole 16.

The gate electrode 2 and the storage capacitance lower-electrode 14 are provided on the glass substrate 1. The semiconductor layer 9 is formed on the upper side of the gate electrode 2 with the gate insulation layer 15 formed therebetween. Further, the source electrode 8 and the drain electrode 5 are formed on the semiconductor layer 9.

Meanwhile, the gate insulation layer 15 is provided on the upper side of the storage capacitance lower-electrode 14. Further, the storage capacitance upper-electrode 13 is provided on the upper side of the gate insulation layer 15. The charge collection electrode 11 and the storage capacitance upper-electrode 13 are connected to each other by the contact hole 16, which penetrates the interlayer insulation layer 12. Macroscopically, the contact hole 16 has a so-called quadrilateral shape, such as a square and a rectangle. However, microscopically, all of the corner portions of the contact hole 16 are not at right angles but rounded (curved). The curvature radius of each of the four corner portions of the contact hole 16 is greater than or equal to 2 μm.

Further, a high-voltage power source (approximately 2 kV), which is not illustrated, is provided between the bias electrode 7 and the storage capacitance lower-electrode 14. The high-voltage power source applies voltage between the bias electrode 7 and the storage capacitance lower-electrode 14. Accordingly, it is possible to generate an electric field between the bias electrode 7 and the charge collection electrode 11 through the charge storage capacitance. At this time, the photoelectric conversion layer 6 and the charge storage capacitance are electrically connected to each other in series. Therefore, when bias voltage is being applied to the bias electrode 7, charges (pairs of electrons and holes) are generated in the photoelectric conversion layer 6. The electrons generated in the photoelectric conversion layer 6 move toward a positive electrode side, and the holes generated in the photoelectric conversion layer 6 move toward a negative electrode side. Consequently, charges are stored (accumulated) in the charge storage capacitance.

In the whole image detection apparatus, a plurality of charge collection electrodes 11 are two-dimensionally arranged. Further, a plurality of charge storage capacities are connected to the charge collection electrodes 11, respectively, and a plurality of TFT switches 4 are connected to the plurality of charge storage capacities, respectively. Accordingly, it is possible to easily read out two-dimensional charge information by temporarily storing two-dimensional electromagnetic wave information in the charge storage capacities and by sequentially switching the TFT switches 4.

Next, one of examples of the production process of the image detection apparatus will be described.

First, a metal film made of Ta, Al or the like is deposited on the glass substrate 1 by sputter vapor deposition to form a layer having a thickness of approximately 300 nm. Then, patterning is performed on the metal film deposited on the glass substrate 1 to form a desirable shape. Accordingly, the gate electrode 2 and the charge capacitance lower-electrode 14 are formed.

Then, the gate insulation layer 15 made of SiNx, SiOx or the like is deposited on a substantially entire surface of the glass substrate 1 by using a CVD (Chemical Vapor Deposition) method. The gate insulation layer 15 is deposited in such a manner to coat (cover) the gate electrode 2 and the storage capacitance lower-electrode 14 and to have a thickness of approximately 350 nm. It is not necessary that the gate insulation layer 15 is made of SiNx or SiOx. Further, an anodized film (layer) obtained by anodizing the gate electrode 2 and the storage capacitance lower-electrode 14 may be used together with the gate insulation layer 15.

Then, the semiconductor layer 9 is formed by depositing a-Si by using the CVD method so that the semiconductor layer 9 is provided on the upper side of the gate electrode 2 with the gate insulation layer 15 formed therebetween. The thickness of the semiconductor layer is approximately 40 nm. Then, patterning is performed on the semiconductor layer 9 to form a desirable shape. Accordingly, the semiconductor layer 9 is formed.

Then, a metal film made of Ta, Al or the like is deposited on the semiconductor layer 9 by sputter vapor deposition. The thickness of the metal film is approximately 300 nm. After the metal film is deposited, patterning is performed on the metal film to form a pattern having a desirable shape. Accordingly, the source electrode 8 and the drain electrode 5 are formed. Further, the storage capacitance upper-electrode 13 is formed on the upper side of the charge capacitance lower-electrode 14, and the data wire 3 is formed at a predetermined position.

In this way, the TFT switch 4, the charge storage capacitance and the like are formed on the glass substrate 1. Then, a photosensitive alkaline resin or the like is deposited on a substantially entire surface of the glass substrate 1 so that the thickness of the photosensitive alkaline resin is approximately 3 μm. Accordingly, the interlayer insulation layer 12 is formed.

Figure 3A:
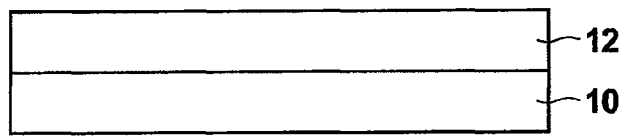
FIG. 3A is a schematic diagram illustrating a process of producing the image detection apparatus according to the present invention.
Figure 3B:
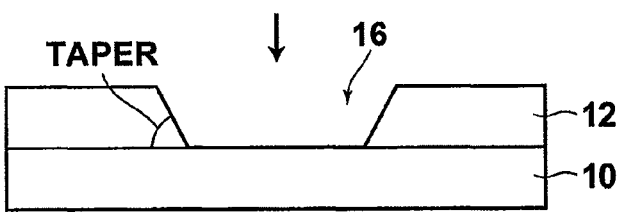
FIG. 3B is a schematic diagram illustrating a process of producing the image detection apparatus according to the present invention.
Figure 3C:
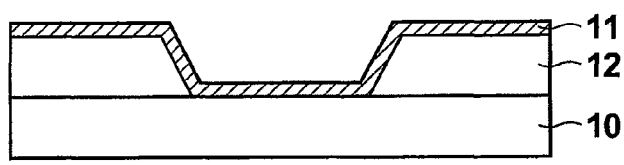
FIG. 3C is a schematic diagram illustrating a process of producing the image detection apparatus according to the present invention.
Figure 3D:
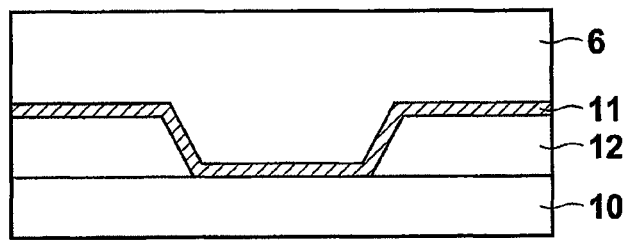
FIG. 3D is a schematic diagram illustrating a process of producing the image detection apparatus according to the present invention.
Figure 4:
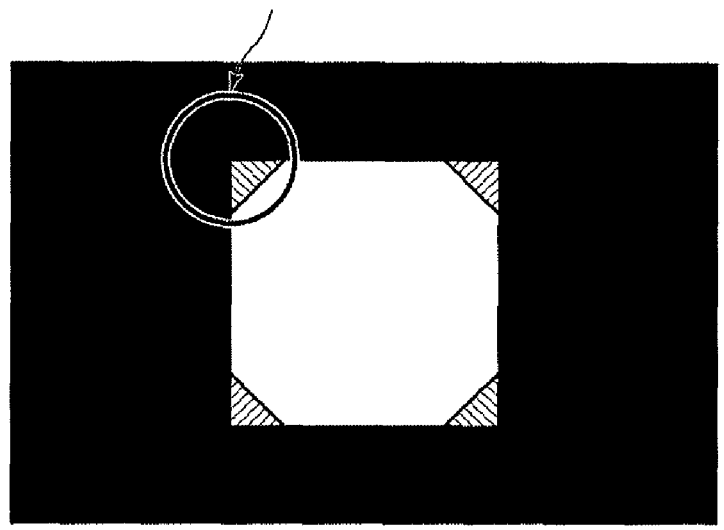
FIG. 4 is a schematic diagram illustrating a plan view of a photomask.

Formation of the contact hole 16 will be described in detail with reference to FIGS. 3A through 3D. FIGS. 3A through 3D are schematic diagrams illustrating a process from formation of the contact hole till formation of the photoelectric conversion layer. First, a photomask for photolithography is prepared. Each corner portion of a contact hole pattern in the photomask is beveled (chamfered or diagonally cut or rounded), as illustrated in FIG. 4. Here, a photomask that can form a contact hole of 12×12 μm (the size of the upper part of the contact hole is 12×12 μm) is used. Further, a desirable curvature radius, which will be described later, can be obtained by appropriately adjusting the beveled portion formed in each of the corner portions of the contact hole pattern.

The position of a contact-hole-16 formation pattern of the photomask is adjusted with respect to the interlayer insulation layer 12 so that a contact hole is formed at an appropriate position. Then, the photomask is fixed and photolithography (exposure) is performed on the interlayer insulation layer 12 (FIG. 3A). Next, patterning of the contact hole is performed by performing etching using an organic solvent. Accordingly, the contact hole 16 is formed (FIG. 3B).

The contact hole 16 is tapered at 30 degrees. When a photosensitive interlayer insulation layer is selected, such a taper can be formed by optimizing the condition of post-baking that is performed after development. Specifically, this material is thermally cured by being baked at a temperature around 150 to 250° C. after development, and an insulation layer is formed. However, if the material is baked (melt baked) at a temperature around 100° C., which is less than or equal to a cure reaction temperature (crosslinking temperature), before thermally curing the material, the material is melted by heat and the angle of the taper becomes smaller.

After the contact hole 16 is formed, an amorphous transparent conductive oxide layer made of ITO (Indium-Tin-Oxide) or the like is formed on the interlayer insulation layer 12. The amorphous transparent conductive oxide layer is formed by using a sputter vapor-deposition method and the thickness of the layer is approximately 200 nm. Then, patterning is performed on the amorphous transparent conductive oxide layer so as to form a desirable shape. Accordingly, the charge collection electrode 11 is formed (FIG. 3C). At this time, the charge collection electrode 11 and the storage capacitance upper-electrode 13 are electrically connected to each other (short-circuited) through the contact hole 16 formed in the interlayer insulation layer 12. The charge collection electrode 11 is formed by using a vapor deposition method. Therefore, it is possible to form the charge collection electrode 11 without changing the shape of the contact hole that has been formed (the shape of the contact hole is maintained).

As described above, in the present embodiment, a so-called roof-type structure (mushroom electrode structure) is adopted as the structure of the active matrix substrate 10. In the active matrix substrate 10 having the roof-type structure, the charge collection electrode 11 is provided on the upper side of the TFT switch 4 in such a manner that they overlap with each other. However, it is not necessary to adopt the active matrix substrate 10 that has the roof-type structure. Instead, an active matrix substrate that has a non-roof-type structure may be adopted. Further, in the present embodiment, a TFT 4 using a-Si is used as the switching device. Alternatively, a TFT 4 using p-Si (poly-silicon) may be used. Further, in the present embodiment, an inverse-staggered structure is adopted. In the inverse-staggered structure, the data wire 3 and the storage capacitance upper-electrode 13 are provided above the gate electrode 2 and the gate insulation layer 15 is provided between the data wire 3 and the gate electrode 2 and between the storage capacitance upper-electrode 13 and the gate electrode 2. Alternatively, a staggered structure may be adopted.

Figure 5:
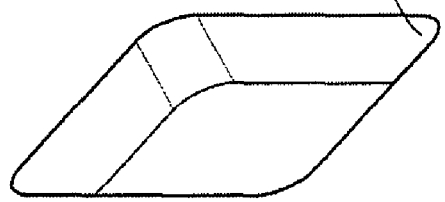
FIG. 5 is a diagram illustrating an enlarged perspective view of a contact hole.
Figure 6:
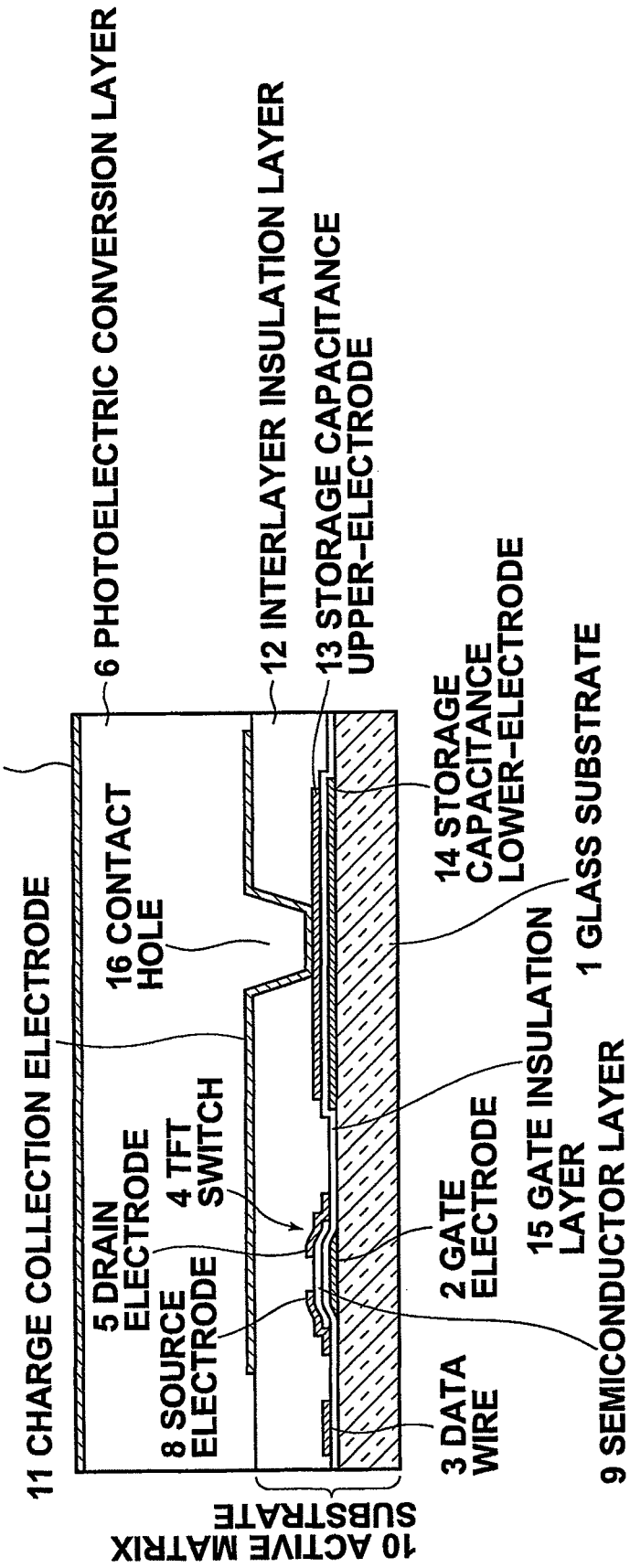
FIG. 6 is a schematic diagram illustrating a plan view of an image detection apparatus according to the related art, the plan view showing the structure of a one-pixel portion of the image detection apparatus.
Figure 7:
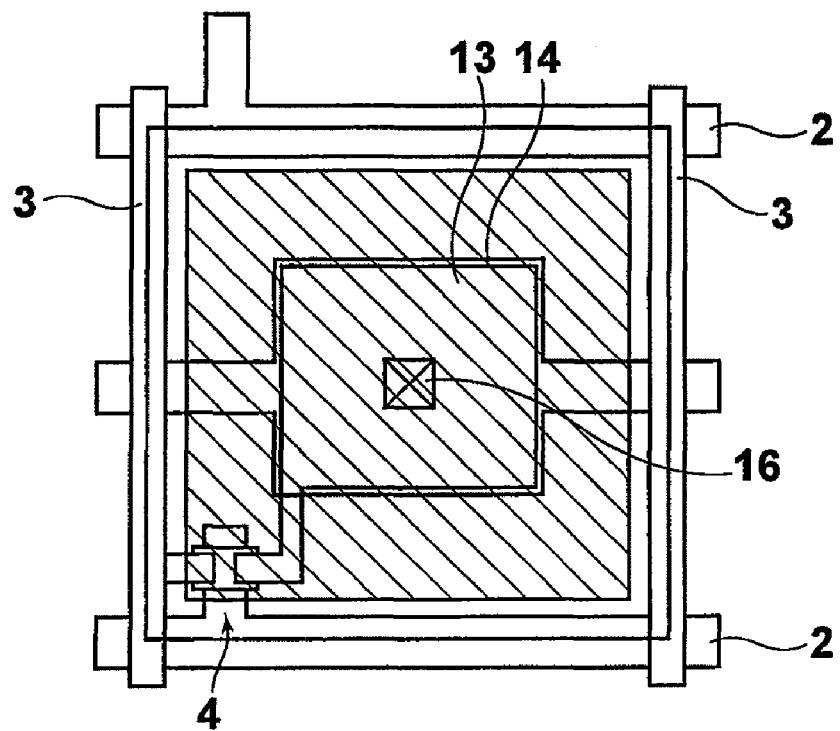
FIG. 7 is a schematic diagram illustrating a plan view of an image detection apparatus according to the related art, the plan view showing the structure of a one-pixel portion of the image detection apparatus.

Then, a photoelectric conversion layer 6 is formed by using a vacuum vapor-deposition method so that the whole pixel arrangement area of the active matrix substrate 10, which has been formed as described above, is coated with the photoelectric conversion layer 6. The photoelectric conversion layer 6 is made of a-Se and conducts electromagnetic waves. The thickness of the photoelectric conversion layer 6 is in the range of approximately 0.5 mm to 1.5 mm (FIG. 3D). FIG. 5 is a schematic diagram illustrating a perspective view of a contact hole that has been finally formed. Each of the corners of the contact hole has R form because exposure has been performed using a photomask, the corner portions of which have been beveled.

Figure 8:
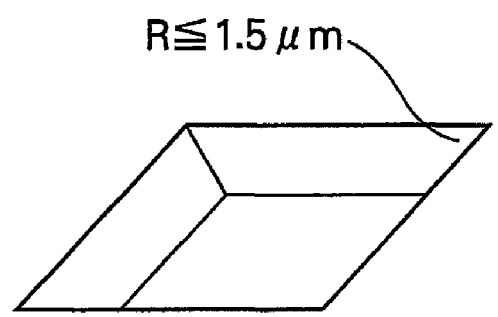
FIG. 8 is a diagram illustrating an enlarged perspective view of a contact hole according to the related art.

As illustrated in FIG. 8, the contact hole according to the related art has a curvature radius of approximately $R \leqq 1.5$ μm. If the contact hole has such a shape, the deposition density of atoms in the vicinity of a height difference portion tends to become thin (low). Consequently, the internal stress of a vapor-deposition layer that is deposited on this portion becomes large, and crystallization of a-Se that is deposited by evaporation is induced at the corner portions. However, in the present embodiment, the curvature radius of the corner portion of the contact hole is R=4 μm, as illustrated in FIG. 5. Therefore, the internal stress is reduced and crystallization is suppressed. Consequently, it is possible to reduce leak electric current.

In the above description, a case in which the curvature radius is R=4 μm has been described. The curvature radius may be a different value that is appropriate for the size of the contact hole. If the size of the contact hole is in the range of 6×6 μm to 20×20 μm (the contact hole may be a rectangle), the curvature radius may be $R \geqq 2$ μm. If the size of the contact hole is in the range of 8×8 μm to 16×16 μm (square), the curvature radius may be $3\ \mu m \leqq R \leqq 5$ μm (the contact hole should not be a circle). The curvature radius is value R obtained by measuring the contact hole at the lower part thereof. The curvature radius can be measured by obtaining an image using a digital optical microscope and by using image processing software. In general image processing software, the curvature radius is calculated using three points on R.

Finally, a bias electrode 7 made of Au, Al or the like is formed on the substantially entire surface of the photoelectric conversion layer 6 by using a vacuum vapor-deposition method. The bias electrode 7 has a thickness of approximately 200 nm.

Further, a charge injection inhibition layer or a buffer layer may be formed at the interface between the photoelectric conversion layer 6 and the charge collection electrode 11. The charge injection inhibition layer inhibits (prevents) injection of electrons or holes into the photoelectric conversion layer 6 and the buffer layer improves the close-contact characteristic between the photoelectric conversion layer 6 and the charge collection electrode 11. Similarly, a charge injection inhibition layer or a buffer layer may be formed at the interface between the photoelectric conversion layer 6 and the bias electrode 7. As the material for the charge injection inhibition layer and the buffer layer, a-$As_sSe_3$, a-Se to which alkaline element ions or halogen element ions have been added or the like may be used. In this case, the charge injection inhibition layer and the buffer layer are also formed by vapor deposition. Therefore, it is possible to form these layers without changing the shape of the formed contact hole (the shape of the contact hole is maintained).

The principle of the operation of the image detection apparatus, which is structured as described above, will be briefly described. If the photoelectric conversion layer 6 is irradiated with X rays while electric voltage is applied between the bias electrode 7 and the charge collection electrode 11, charges (electron-hole pairs) are generated in the photoelectric conversion layer 6. Since the photoelectric conversion layer 6 and the charge storage capacitance are electrically connected in series, electrons generated in the photoelectric conversion layer 6 move to the positive electrode side and holes generated in the photoelectric conversion layer 6 move to the negative electrode side. Consequently, charges are accumulated in the charge storage capacitance.

The charges accumulated in the charge storage capacitance can be output to the outside of the image detection apparatus through the data wire 3 by turning on the TFT switch 4. The TFT switch 4 is turned on by a signal input to the gate electrode 2.

All of the gate electrodes 2, the data wires 3, the TFT switches 4 and the charge storage capacities are arranged in XY matrix form. Therefore, it is possible to obtain two-dimensional X-ray image information by sequentially inputting signals to the gate electrodes 2 and by detecting a signal from each of the data wires 3.

In the explanation of the present embodiment, the image detection apparatus including the smoothing layer (interlayer insulation layer), the collection electrode, the photoelectric conversion layer and the signal extraction electrode has been described as an example. In the image detection apparatus, the smoothing layer is formed on the substrate. The smoothing layer has a quadrilateral (square, rectangle or the like) contact hole and the curvature radius of each of the corner portions of the contact hole is greater than or equal to 2 μm. Further, the collection electrode is formed at the contact hole portion of the smoothing layer. The photoelectric conversion layer is made of an amorphous material and deposited on the smoothing layer in which the collection electrode has been formed. The signal extraction electrode is connected to the collection electrode through the contact hole. When the middle layer includes a quadrilateral hole, if the curvature radius of each of the corner portions of the quadrilateral hole is greater than or equal to 2 μm, it is possible to suppress crystallization of the amorphous photoelectric conversion layer deposited on the middle layer. Therefore, it is possible to reduce leak current.

Further, in the present embodiment, a case in which the curvature radius of each of the corner portions of the contact hole is greater than or equal to 2 μm has been described as an example. However, it is not necessary that the corner portions form a perfect circle. Each of the corner portions may be rounded in a manner that is sufficient to ease (reduce) the internal stress.

What is claimed is:

1. An image detection apparatus comprising:
    a substrate;
    a middle layer formed on the substrate, the middle layer having a quadrilateral hole; and
    a photoelectric conversion layer deposited on the middle layer, the photoelectric conversion layer being made of an amorphous material, wherein the curvature radius of each of the corner portions of the quadrilateral hole is greater than or equal to 2 μm.

2. An image detection apparatus, as defined in claim 1, further comprising a voltage application electrode formed on the photoelectric conversion layer.

3. An image detection apparatus, as defined in claim 2, wherein the photoelectric conversion layer is made of a material containing amorphous Se as a main component, the material being deposited by using a vapor-deposition method.

4. An image detection apparatus, as defined in claim 3, wherein the side wall of the contact hole is tapered.

5. An image detection apparatus, as defined in claim 1, wherein the photoelectric conversion layer is made of a material containing amorphous Se as a main component, the material being deposited by using a vapor-deposition method.

6. An image detection apparatus, as defined in claim 5, wherein the side wall of the contact hole is tapered.

7. An image detection apparatus comprising:
    a substrate;
    a smoothing layer formed on the substrate, the smoothing layer having a quadrilateral contact hole;
    a collection electrode formed at least in the quadrilateral contact hole of the smoothing layer;
    a photoelectric conversion layer deposited on the smoothing layer, in which the collection electrode is formed, the photoelectric conversion layer being made of an amorphous material; and
    a signal extraction electrode connected to the collection electrode through the quadrilateral contact hole, wherein the curvature radius of each of the corner portions of the quadrilateral contact hole is greater than or equal to 2 μm.

8. An image detection apparatus, as defined in claim 7, wherein the photoelectric conversion layer is made of a material containing amorphous Se as a main component, the material being deposited by using a vapor-deposition method.

9. An image detection apparatus, as defined in claim 8, wherein the side wall of the contact hole is tapered.

10. An image detection apparatus, as defined in claim 7, wherein the side wall of the contact hole is tapered.

11. A method for producing an image detection apparatus, the method comprising the steps of:
    applying a smoothing layer to a flat substrate;
    performing photolithography on the smoothing layer using a photomask so as to form a quadrilateral hole in the smoothing layer, the photomask having a hole portion with a beveled edge; and
    depositing an amorphous photoelectric conversion material on the smoothing layer by using a vapor deposition method.

* * * * *